US011326969B2

(12) United States Patent
Zehringer et al.

(10) Patent No.: US 11,326,969 B2
(45) Date of Patent: May 10, 2022

(54) LINEARIZED MICROMECHANICAL SENSOR

(71) Applicant: Robert Bosch GmbH, Stuttgart (DE)

(72) Inventors: Stefan Zehringer, Reutlingen (DE); Andreas Duell, Stuttgart (DE); Arne Dannenberg, Metzingen (DE); Helmut Grutzeck, Kusterdingen (DE); Jochen Franz, Reutlingen (DE); Mike Schwarz, Kusterdingen (DE); Soeren Zimmermann, Reutlingen (DE); Stephan Oppl, Pfullingen (DE)

(73) Assignee: Robert Bosch GmbH, Stuttgart (DE)

( * ) Notice: Subject to any disclaimer, the term of this patent is extended or adjusted under 35 U.S.C. 154(b) by 521 days.

(21) Appl. No.: 16/471,221

(22) PCT Filed: Dec. 8, 2017

(86) PCT No.: PCT/EP2017/081938
§ 371 (c)(1),
(2) Date: Jun. 19, 2019

(87) PCT Pub. No.: WO2018/127352
PCT Pub. Date: Jul. 12, 2018

(65) Prior Publication Data
US 2020/0088598 A1     Mar. 19, 2020

(30) Foreign Application Priority Data

Jan. 4, 2017   (DE) .......................... 102017200057.0

(51) Int. Cl.
*G01L 9/00*      (2006.01)
*B81B 3/00*      (2006.01)

(52) U.S. Cl.
CPC .......... *G01L 9/0072* (2013.01); *B81B 3/0059* (2013.01); *B81B 2201/0235* (2013.01);
(Continued)

(58) Field of Classification Search
None
See application file for complete search history.

(56) References Cited

U.S. PATENT DOCUMENTS 5,177,579 A * 1/1993 Jerman ................. G01L 9/0073
257/419
2013/0000411 A1   1/2013 Robert et al.
(Continued)

FOREIGN PATENT DOCUMENTS

DE             19740244 A1     2/1998

OTHER PUBLICATIONS

International Search Report for PCT/EP2017/081938, dated May 8, 2018.

*Primary Examiner* — Peter J Macchiarolo
*Assistant Examiner* — Jermaine L Jenkins
(74) *Attorney, Agent, or Firm* — Norton Rose Fulbright US LLP; Gerard Messina

(57) ABSTRACT

A micromechanical sensor includes a substrate having a cavity; a flexible diaphragm spanning the cavity; and a lever element that spans the diaphragm and has a first and second end section on opposite sides of a center section. A first joint element is between the first end section and the substrate and a second joint element is between the center section and the diaphragm. The lever element can be pivoted due to a deflection of the diaphragm. Two capacitive sensors are provided, each having two electrodes, one electrode of each sensor being mounted at one of the end sections of the lever element, and the other being mounted on the substrate. The electrodes are disposed so that distances between the electrodes of different sensors are influenced oppositely when the lever element is pivoted. Also, an actuator is provided for applying an actuating force between the lever element and the substrate.

10 Claims, 4 Drawing Sheets

(52) U.S. Cl.
CPC ............ *B81B 2201/0264* (2013.01); *B81B 2203/0127* (2013.01); *B81B 2203/0181* (2013.01); *B81B 2203/0315* (2013.01); *B81B 2203/04* (2013.01); *B81B 2203/058* (2013.01)

(56) References Cited

U.S. PATENT DOCUMENTS

| | | | |
|---|---|---|---|
| 2014/0060169 A1* | 3/2014 | McNeil | B60C 23/0408 |
| | | | 73/718 |
| 2015/0268115 A1 | 9/2015 | Robert et al. | |
| 2016/0169760 A1 | 6/2016 | McNeil et al. | |
| 2017/0108391 A1* | 4/2017 | Ikehashi | G01L 9/12 |

* cited by examiner

LINEARIZED MICROMECHANICAL SENSOR

BACKGROUND INFORMATION

The present invention relates to a micromechanical sensor. In particular, the invention relates to a linearized sensor, in which a relationship between a sampled signal of the sensor and a sensed physical quantity is improved by linearizing.

A micromechanical sensor is furnished to sense a physical quantity. For example, this quantity may relate to an acceleration or an atmospheric pressure. In this context, the micromechanical sensor (also known as micro-electromechanical or micro-mechatronic sensor) is miniaturized with an extension in the range of approximately 20 μm to approximately 1 mm. Structures of the micromechanical sensor usually have extensions between approximately 1 and approximately 100 μm.

The micromechanical sensor typically includes a substrate and a movable element whose position relative to the substrate is a function of the physical quantity to be determined. The position is determined with the aid of a capacitive sensor that includes a first electrode mounted on the substrate and a second electrode mounted on the movable element. A capacitance of the sensor is dependent on a relative spacing of the electrodes, so that the physical quantity may be determined on the basis of the capacitance of the sensor. However, the relationship between the physical quantity and the capacitance or change in capacitance of the sensor is usually extremely non-linear. The linearity may be improved by using a plurality of capacitive sensors that are influenced oppositely by the movement of the movable element. In particular, a distance between electrodes of the first sensor may increase when a distance between the electrodes of the second sensor decreases and vice versa. The capacitances of the sensors may be determined individually and subtracted from each other in order to provide a linearized signal indicating the physical quantity.

However, the relationship between the physical quantity or the deflection of the movable element and the signal determinable on the basis of the capacitances is thereby sufficiently linear only in a small subrange. Particularly in the case of a larger positive or negative deflection of the movable element, when the distance between the electrodes of one of the capacitive sensors approaches zero, the sensor generally behaves in highly non-linear fashion.

SUMMARY

One object of the present invention is to provide a technique which permits improved linearized sensing of a physical quantity by a micromechanical sensor. The present invention may achieves this objective with the aid of the example embodiments described herein.

In accordance with the present invention, a micromechanical sensor is provided which includes a substrate having a cavity; a flexible diaphragm that spans the cavity; and a lever element that spans the diaphragm and has a first and a second end section, the end sections lying on opposite sides of a center section. A first joint element is fitted between the first end section and the substrate and a second joint element is fitted between the center section and the diaphragm, so that the lever element is able to be pivoted due to a deflection of the diaphragm. In addition, two capacitive sensors are provided, each having two electrodes, one electrode of each capacitive sensor being mounted at one of the end sections of the lever element, and the other being mounted on the substrate. The electrodes of the capacitive sensors are disposed in such a way that distances between the electrodes of different capacitive sensors are influenced oppositely when the lever element is pivoted. The micromechanical sensor also includes an actuator for applying an actuating force between the lever element and the substrate.

Due to the actuating force, the sensor may be brought into a range in which a relationship between a physical quantity acting externally on the diaphragm and a signal provided on the basis of the capacitances of the sensors is better linearized. A measuring range of the sensor or a sensitivity may be improved. In particular, the accuracy of the sensor may be subject to reduced fluctuations over an enlarged measuring range.

It is especially preferred that the actuator operates on the basis of an electrostatic attractive force. To that end, the actuator includes a first electrode mounted on the substrate and a second electrode mounted on the lever element. If a control voltage is applied to the electrodes, then the electrodes are attracted to each other electrostatically. The force of attraction acting in this case is essentially a function of the magnitude of the control voltage.

The electrostatic actuator may be constructed in space-saving fashion. The same processes may be used to produce the actuator as for producing one of the capacitive sensors. The electrostatic attractive force is able to be changed quickly and to be sufficient in its amount to actuate the lever element.

It is especially preferred that two actuators are provided at different end sections of the lever element. Namely, if the actuators are implemented electrostatically, a resulting force may then act on the lever element in both directions. If the sensors are likewise provided at different end sections of the lever element, improved integration with the actuators may be achieved.

The micromechanical sensor may also include a control device for driving the actuator and for determining a signal dependent on the deflection of the diaphragm. The control device may be integrated with the capacitive sensor. Both the micromechanical sensor and the control device may include semiconductors that may be produced by the same or at least similar fabrication techniques. Due to the integration, signal paths may be shortened and the compensation or prestress of the lever element for the linearization of the sensor characteristic may be improved. External provision of a signal for driving the actuator may be unnecessary.

In a further specific embodiment, the control device is equipped to determine the signal, dependent on the deflection of the diaphragm, on the basis of the capacitances of the sensors, as well.

In other words, in a first variant, the actuator may be driven on the basis of the capacitances of the sensors to bring the lever element into a predetermined position, the signal that is indicative of the physical force acting on the diaphragm being derived from the drive signal of the actuator. In a second variant, based on the capacitances of the sensors, the lever element is moved by the actuator within a predetermined range in which the relationship between the physical quantity and the signal is sufficiently linear. The signal is then provided as a superimposition of a first component, which is determined on the basis of the driving of the actuator, and a second component which is derived from the capacitances of the sensors.

The sensor described may be used for various purposes. In a first variant, the cavity is closed relative to a surrounding area, the sensor being furnished to determine an atmospheric pressure in the outer area. In another variant, a mass element is mounted on the diaphragm, the sensor being furnished to determine an acceleration. In this variant, preferably a further opening exists between the cavity and the outer area.

A method for controlling the sensor described above includes the following steps: determining capacitances of the capacitive sensors; driving the actuator as a function of the determined capacitances, in order to bring a pivot angle of the lever element into a predetermined range; and determining a signal, which is dependent on the deflection of the diaphragm, on the basis of the driving.

If the signal is determined solely on the basis of the driving of the actuator, then the predetermined range of the pivot angle is usually small. The larger the range of the pivot angle, the greater a measuring error may be.

In another specific embodiment, the signal is determined additionally on the basis of the capacitances of the capacitive sensors. In this specific embodiment, preferably the predetermined range of the pivot angle is selected in such a way that the relationship between the physical quantity, which acts on the diaphragm, and the signal provided on the basis of the sensors is essentially linear. In this case, the predetermined range of the pivot angle is normally considerably larger. The driving of the actuator only has to be changed when the pivot angle threatens to run out of the predetermined range.

If, as was described in greater detail above, the actuator is equipped to exert an electrostatic actuating force on the lever element, then electrodes of one of the capacitive sensors may coincide with the electrodes of the actuator. The method described may include the driving of the electrodes alternately in rapid succession as capacitive sensor and as actuator. Such a process is known as multiplexing. In this instance, the electrodes may occupy a larger space and therefore be more effective in the case of the actuator or more sensitive in the case of the sensor. A minimal frequency of change between the operation as capacitive sensor and as actuator usually depends on an inertia of the lever element in terms of its pivot angle.

BRIEF DESCRIPTION OF THE DRAWINGS

The present invention is described in greater detail below with reference to the figures.

DETAILED DESCRIPTION OF EXAMPLE EMBODIMENTS

Figure 1:
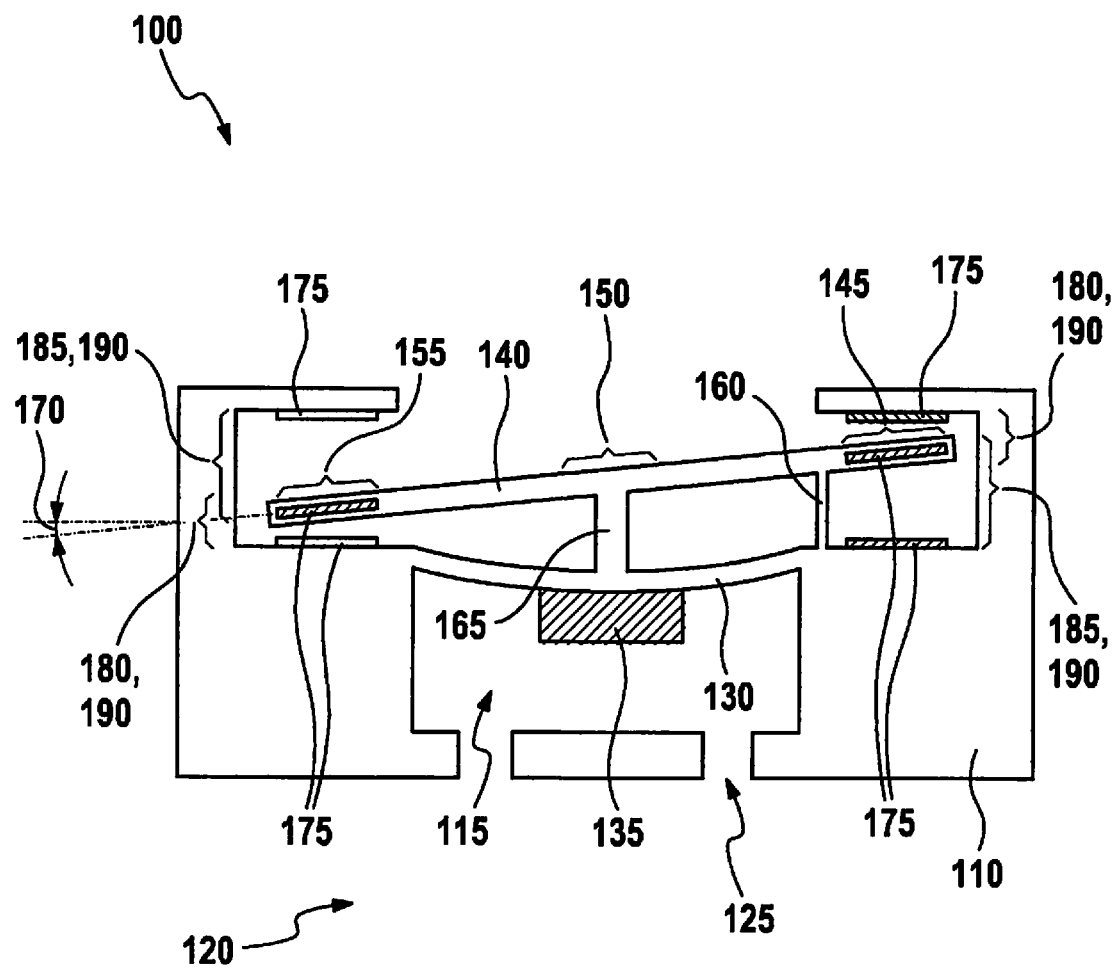
FIG. 1 shows a schematic representation of a micromechanical sensor.

FIG. 1 shows a schematic representation of a micromechanical sensor 100. The specific embodiment of sensor 100 shown is furnished in exemplary manner to determine an acceleration, in the vertical direction in the representation of FIG. 1.

Sensor 100 includes a substrate 110 that usually contains silicon or some other semiconductor material, a cavity 115 being formed in substrate 110. An opening 125 may be provided to equalize an atmospheric pressure between cavity 115 and a surrounding area 120. Stretched over cavity 115 is a diaphragm 130 which, like substrate 110, may contain a semiconductor material. Preferably, diaphragm 130 is joined at its edges to substrate 110. In one preferred specific embodiment, a mass element 135 is mounted on diaphragm 130, and specifically, preferably near its center. If substrate 110 in the representation of FIG. 1 is accelerated in the vertical direction, then the inertia of mass of mass element 135 brings about a vertical deflection of diaphragm 130. The mass element preferably contains a semiconductor material, as well.

Stretched over diaphragm 130 is a lever element 140 that has a first end section 145, a center section 150 and a second end section 155. End sections 145 and 155 lie on different sides of center section 150. Therefore, entire lever element 140 is preferably bar-shaped. A first joint element 160 is fitted between first end section 145 and substrate 110. A second joint element 165 is fitted between center section 150 and diaphragm 130. In this context, second joint element 165 preferably engages in an area close to the center of diaphragm 130. First joint element 160 and second joint element 165 may be formed as separate elements between lever element 140 and substrate 110 or diaphragm 130. Likewise, at least one connection of one of the joint elements may be joined integrally to the lever element or the substrate and/or the diaphragm. It is especially preferred that at least one joint element is integrally joined at one end to the material of the lever element and at the other end to the material of the substrate or the diaphragm. By preference, joint elements 160 and 165 likewise contain semiconductor material.

Lever element 140 is affixed with the aid of joint elements 160 and 165 in a manner allowing it to pivot relative to substrate 110 in such a way that a pivot angle 170 is dependent on a deflection of diaphragm 130. If first end section 145 lifts, then second end section 155 falls and vice versa.

In this context, in the area of end sections 145 and 155, substrate 110 is preferably formed in such a way that in each case two sections of substrate 110 lie on different sides of each end section 145, 155 relative to the pivot direction of lever element 140.

An electrode 175 may be provided at each of these sections. In each instance, a further electrode 175 may be provided at each of end sections 145, 155 of lever element 140. Alternatively, lever element 140 may also be produced completely from a conductive material, particularly a metal. Two first capacitive sensors 180 each include an electrode 175, which are mounted at different end sections 145, 155 of lever element 140, and further electrodes 175 which are mounted on substrate 110, distances between electrodes 175 of each first capacitive sensor 180 decreasing when lever element 140 is pivoted clockwise. In addition, two second capacitive sensors 185 are formed, that in each instance include an electrode 175 mounted at different end sections 145, 155 of lever element 140, and two electrodes 175 mounted on substrate 110, distances between electrodes 175 of second capacitive sensors 185 becoming smaller when lever element 140 is pivoted clockwise.

In other specific embodiments, only one first capacitive sensor 180 and/or only one second capacitive sensor 185 is/are provided. Several capacitive sensors 180, 185 are usually connected in parallel electrically, in order to enlarge the effective areas of electrodes 175 involved, so that sensors 180, 185 provide a larger electrical signal as a function of a mechanical pivot.

For example, a capacitance of one of sensors 180, 185 may be determined with the aid of a voltage pulse. The capacitance of each sensor 180, 185 is normally inversely proportional to a distance between electrodes 175 involved. The distance is a function of pivot angle 170, and it in turn is a function of a deflection of diaphragm 130. In this way, a physical quantity, here an acceleration, which acts on the deflection of diaphragm 130, is causative for a change in the capacitances of capacitive sensors 180 and 185. The relationship between the physical quantity and a determined capacitance may be linearized better, by subtracting the determined capacitance of first capacitive sensor 180 from the determined capacitance of second capacitive sensor 185 or vice versa.

Nevertheless, usually the relationship is linear only for a relatively small range of pivot angle 170. In order to improve the linearity, it is therefore proposed to provide an actuator 190 which exerts a predetermined force on lever element 140, in order to bring pivot angle 170 into a range in which the indicated relationship is sufficiently linear. To that end, a predetermined control voltage may be applied to a pair of electrodes 175, which are then not available for forming a first capacitive sensor 180 or a second capacitive sensor 185. In this specific embodiment, only an attractive force is able to be exerted by an actuator 190, but no repelling force. It is therefore preferred that two of electrostatic actuators 190 described be provided at different end sections 145, 155 of lever element 140. A pair of electrodes 175 may also be operated alternately as capacitive sensor 180, 185 and as actuator 190. In another specific embodiment, a different type of actuator 190 may also be provided, for example, based on a piezoelectric element.

Figure 2:
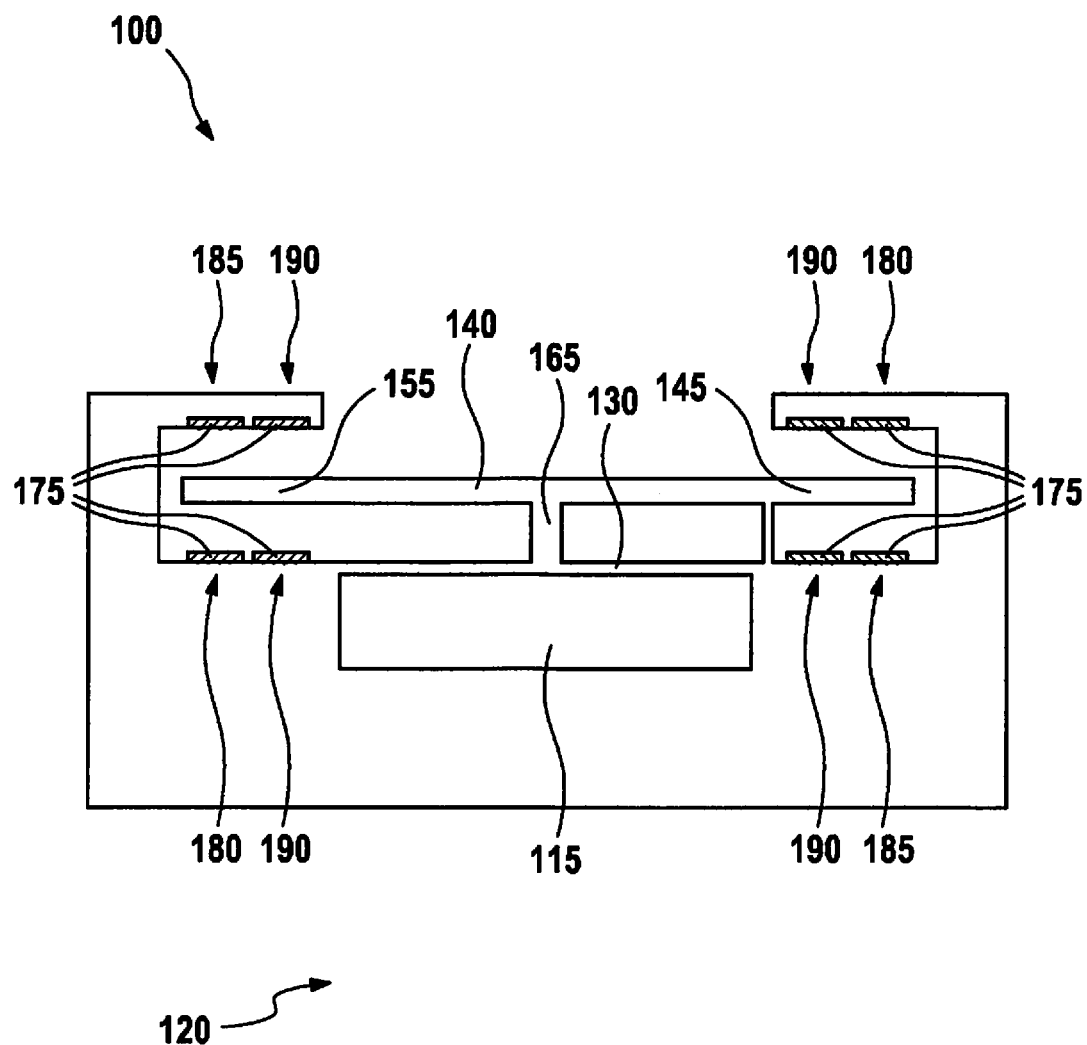
FIG. 2 shows a micromechanical sensor according to FIG. 1 in a further specific embodiment.

FIG. 2 shows a further specific embodiment of a micromechanical sensor 100 according to FIG. 1.

Micromechanical sensor 100 shown is furnished to determine a pneumatic pressure in surrounding area 120 of sensor 100. To that end, cavity 115 is closed on all sides. The placement of diaphragm 130 and lever element 140 corresponds to the specific embodiment described with respect to FIG. 1. In the specific embodiment shown, in each case two electrodes 175 are provided on each side of each end section 145, 155, so that first capacitive sensor or sensors 180, second capacitive sensor or sensors 185 and actuator or actuators 190 may be formed independently of each other. In the specific embodiment illustrated, lever element 140 is completely conductive and therefore acts overall as electrode 175. Purely by way of example, in each case actuators 190 are depicted closer than capacitive sensors 180, 185 to second joint element 165, although in other specific embodiments, the placement may also be changed.

Figure 3:
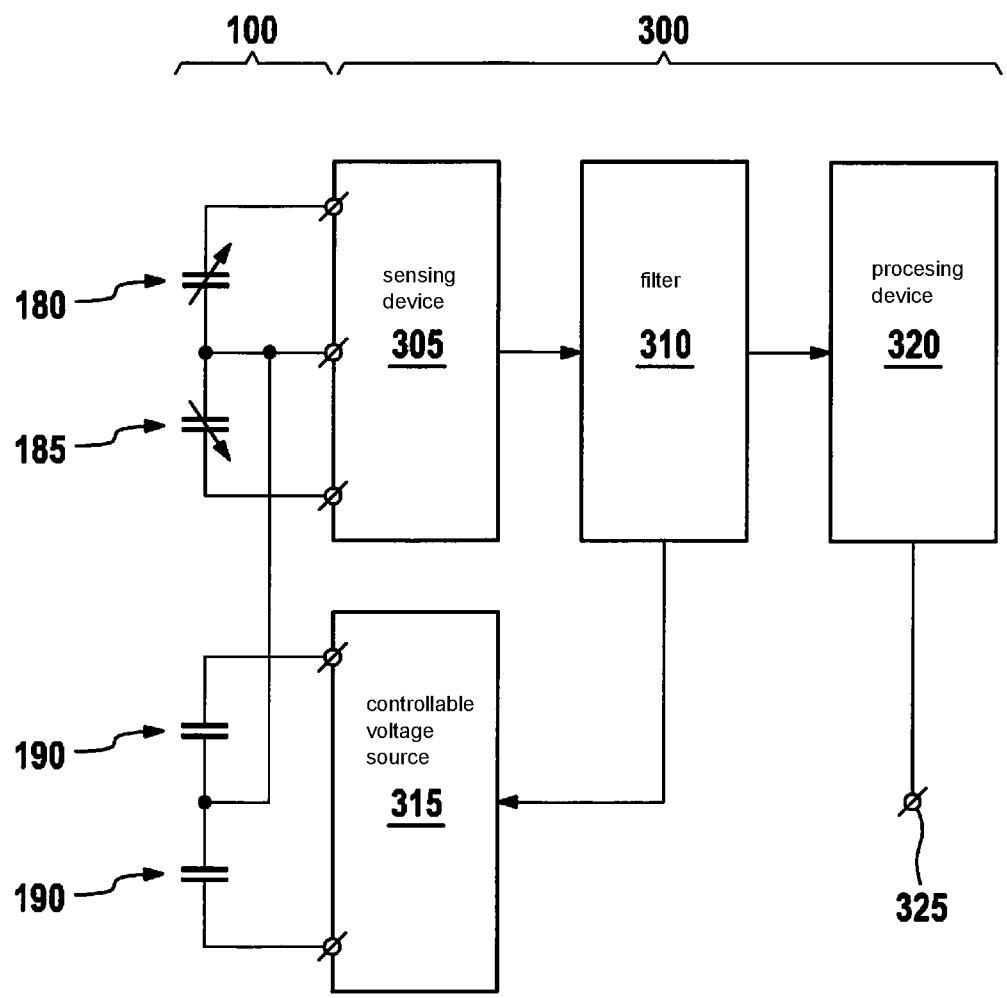
FIG. 3 shows a control device 300 for the micromechanical sensor according to one of FIG. 1 or 2.

FIG. 3 shows a control device 300 for micromechanical sensor 100 according to one of the preceding figures. In particular, control device 300 may be built up using semiconductor technology, and preferably integrated with micromechanical sensor 100. In one specific embodiment, sensor 100 includes control device 300. Control device 300 is equipped to drive actuator 190 with a control voltage and to provide a signal which is indicative of the physical quantity that is able to act on diaphragm 130 of micromechanical sensor 100, deflecting it.

Control device 300 preferably includes a sensing device 305 for determining capacitances of capacitive sensors 180, 185, a filter 310 for determining the control voltage, a controllable voltage source 315 for providing the determined control voltage to actuator 190, as well as preferably a processing device 320 and, also by preference, an interface 325. The capacitance of capacitive sensors 180, 185 determined with the aid of sensing device 305, or rather the difference between the determined capacitances is indicative of pivot angle 170 of lever element 140. Filter 310 is equipped preferably to generate a control voltage that makes it possible to bring pivot angle 170 either to a predetermined value or into a predetermined range. If pivot angle 170 corresponds to the predetermined value, then the physical quantity, which is acting on diaphragm 130, may be determined on the basis of the control voltage. If pivot angle 170 merely lies within the predetermined range, then in addition to the control voltage, preferably the capacitance signal determined with the aid of sensing device 305 is also evaluated in order to determine the physical quantity. In both variants, preferably the physical quantity is determined by processing device 320. To that end, in particular, processing device 320 may include a programmable microcomputer or microcontroller, in one preferred specific embodiment, in a variant as a digital signal processor (DSP). Filter 310 may likewise be included by processing device 320 or constructed separately from it. In this context, filter 310 may be constructed in digital fashion, particularly using a further processing device, or in analog fashion, particularly with the aid of active and passive electronic components. At interface 325, processing device 320 preferably makes a signal available, particularly a voltage signal, which indicates the determined physical quantity.

Figure 4:
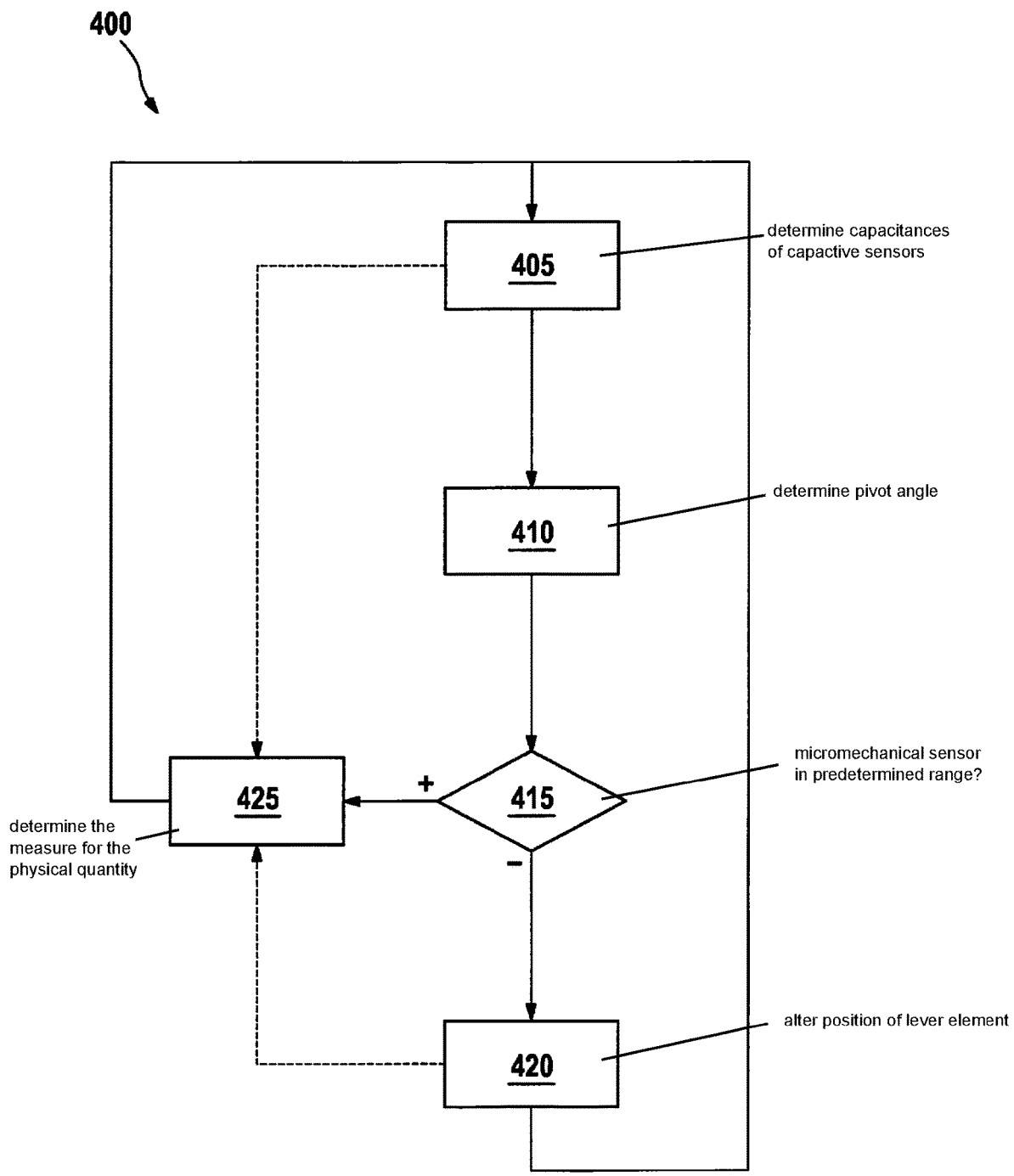
FIG. 4 shows a flowchart for determining a physical quantity with the aid of a micromechanical sensor according to one of FIG. 1 or 2.

FIG. 4 shows a flowchart of a method 400 for determining a measured quantity, especially a physical quantity, which acts on diaphragm 130 of a micromechanical sensor 100, deflecting it. Method 400 may be executed at least partially as a computer-program product on processing device 320 and/or filter 310 of control device 300. In general, it is preferred that control device 300 be equipped to carry out entire method 400.

In a step 405, capacitances of capacitive sensors 180, 185 are determined. For that purpose, in particular a voltage pulse may be induced onto sensors 180, 185. In a following step 410, pivot angle 170 or a variable dependent on it, e.g., the deflection of diaphragm 130, is determined on the basis of the determined capacitances. In a step 415, preferably it is then checked whether micromechanical sensor 100 is in a predetermined range. This is the case when pivot angle 170 assumes a predetermined range or value or the corresponding variable assumes a corresponding value or range. If micromechanical sensor 100 is not within the predetermined range, then preferably in a step 420, the position of lever element 410 is altered by driving actuator 190 differently, in particular by altering the control voltage of actuator 190. If a plurality of actuators 190 are provided, then their driving may be altered in opposite fashion. Method 400 may subsequently return to step 405 and run through again. On the other hand, if it is determined in step 415 that pivot angle 170 is assuming the predetermined value or range, then preferably in a step 425, a measure for the physical quantity is determined on the basis of the driving of actuator 190, and a signal is provided which indicates this measure. Method 400 may likewise subsequently return to step 405 and run through again.

Method 400 may be carried out in two different variants. In a first variant, actuator 190 is driven in such a way that pivot angle 170 corresponds as exactly as possible to a predetermined value. The physical quantity may then be determined solely on the basis of the driving of actuator 190. In a second variant, actuator 190 is only driven in such a way that pivot angle 170 lies in a predetermined range in which preferably a relationship between the physical quantity and a capacitance signal determinable with the aid of capacitive sensors 180, 185 is as linear as possible. In this case, the driving of actuator 190 may be used in a sense as a rough value, while pivot angle 170 indicates a fine value. The signal for the physical quantity may be determined on the basis of a sum of the rough value and the fine value. If the predetermined range for pivot angle 170 is reduced sufficiently, then the second variant described comes closer to the first.

What is claimed is:

1. A micromechanical sensor, comprising:
   a substrate having a cavity;
   a flexible diaphragm which spans the cavity;
   a lever element that spans the diaphragm and has a first end section, a second end section, and a center section, the first end section and the second end section lying on opposite sides of the center section relative to one another;
   a first joint element that is fitted between the first end section and the substrate;
   a second joint element that is fitted between the center section and the diaphragm;
   a first capacitive sensor and a second capacitive sensor, each of the first capacitive sensor and the second capacitive sensor having two electrodes, of which one is mounted at one of the first or second end sections and the other is mounted on the substrate so that distances between the electrodes of different capacitive sensors are influenced oppositely when the lever element is pivoted because of a deflection of the diaphragm; and
   an actuator configured to apply an actuating force between the lever element and the substrate.

2. The sensor as recited in claim 1, wherein the actuator includes a first electrode mounted on the substrate and a second electrode mounted on the lever element, in order to provide an electrostatic attractive force when a control voltage is applied to the first and second electrodes.

3. The sensor as recited in claim 2, wherein two actuators are provided at different end sections of the lever element.

4. The sensor as recited in claim 1, further comprising:
   a control device configured to drive the actuator and to determine a signal dependent on the deflection of the diaphragm.

5. The sensor as recited in claim 4, wherein the control device is equipped to determine the signal, dependent on the deflection of the diaphragm, on the basis of capacitances of the capacitive sensors.

6. The sensor as recited in claim 1, wherein the cavity is closed relative to a surrounding area, and the sensor is configured to determine an atmospheric pressure in the surrounding area.

7. The sensor as recited in claim 1, wherein a mass element is mounted on the diaphragm, and the sensor is configured to determine an acceleration.

8. A method for controlling a micromechanical sensor, the micromechanical sensor including a substrate having a cavity, a flexible diaphragm which spans the cavity, a lever element that spans the diaphragm and has a first end section, a second end section, and a center section, the first end section and the second end section lying on opposite sides of the center section relative to one another, a first joint element that is fitted between the first end section and the substrate, a second joint element that is fitted between the center section and the diaphragm, a first capacitive sensor and a second capacitive sensor, each of the first capacitive sensor and the second capacitive sensor having two electrodes, of which one is mounted at one of the first or second end sections and the other is mounted on the substrate so that distances between the electrodes of different capacitive sensors are influenced oppositely when the lever element is pivoted because of a deflection of the diaphragm, and an actuator configured to apply an actuating force between the lever element and the substrate, the method comprising:
   determining capacitances of the capacitive sensors;
   driving the actuator as a function of the determined capacitances to bring a pivot angle of the lever element into a predetermined range; and
   determining a signal, dependent on the deflection of the diaphragm, on the basis of the driving.

9. The method as recited in claim 8, wherein the signal is determined additionally on the basis of the capacitances of the capacitive sensors.

10. The method as recited in claim 8, wherein the actuator includes a first electrode mounted on the substrate and a second electrode mounted on the lever element, in order to provide an electrostatic attractive force when a control voltage is applied to the first and second electrodes, and wherein
   the electrodes of one of the capacitive sensors coincide with the electrodes of the actuator, and wherein the method further comprises:
   driving of the electrodes alternately in rapid succession as capacitive sensor and as actuator.

* * * * *